United States Patent
Chern et al.

(10) Patent No.: US 9,559,686 B2
(45) Date of Patent: Jan. 31, 2017

(54) INPUT/OUTPUT CIRCUIT

(71) Applicant: TAIWAN SEMICONDUCTOR MANUFACTURING COMPANY, LTD., Hsinchu (TW)

(72) Inventors: Chan-Hong Chern, Palo Alto, CA (US); Tsung-Ching Huang, Mountain View, CA (US); Chih-Chang Lin, San Jose, CA (US); Ming-Chieh Huang, San Jose, CA (US); Fu-Lung Hsueh, Kaohsiung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/944,460

(22) Filed: Nov. 18, 2015

(65) Prior Publication Data
US 2016/0072502 A1 Mar. 10, 2016

Related U.S. Application Data

(63) Continuation of application No. 14/189,653, filed on Feb. 25, 2014, now Pat. No. 9,214,933.

(51) Int. Cl.
H03K 5/13 (2014.01)
H03K 17/687 (2006.01)
H03K 19/0185 (2006.01)
H03K 5/00 (2006.01)

(52) U.S. Cl.
CPC .............. *H03K 17/687* (2013.01); *H03K 5/13* (2013.01); *H03K 19/018521* (2013.01); *H03K 2005/00013* (2013.01)

(58) Field of Classification Search
USPC ............... 327/261, 263, 264, 276, 278, 281, 285,327/288, 298, 299, 108, 112; 326/85, 87, 91
See application file for complete search history.

(56) References Cited

U.S. PATENT DOCUMENTS

| | | |
|---|---|---|
| 4,395,774 A | 7/1983 | Rapp |
| 5,025,178 A | 6/1991 | Nunally |
| 7,183,817 B2 * | 2/2007 | Sanchez ........... H03K 19/01858 327/112 |
| 7,199,618 B2 | 4/2007 | Gliese et al. |
| 7,652,514 B2 | 1/2010 | Lee |

* cited by examiner

*Primary Examiner* — An Luu
(74) *Attorney, Agent, or Firm* — Hauptman Ham, LLP

(57) ABSTRACT

A circuit includes a first power node, a second power node, an output node, a plurality of first transistors and a plurality of second transistors. The plurality of first transistors is serially coupled between the first power node and the output node. The plurality of second transistors is serially coupled between the second power node and the output node.

20 Claims, 11 Drawing Sheets

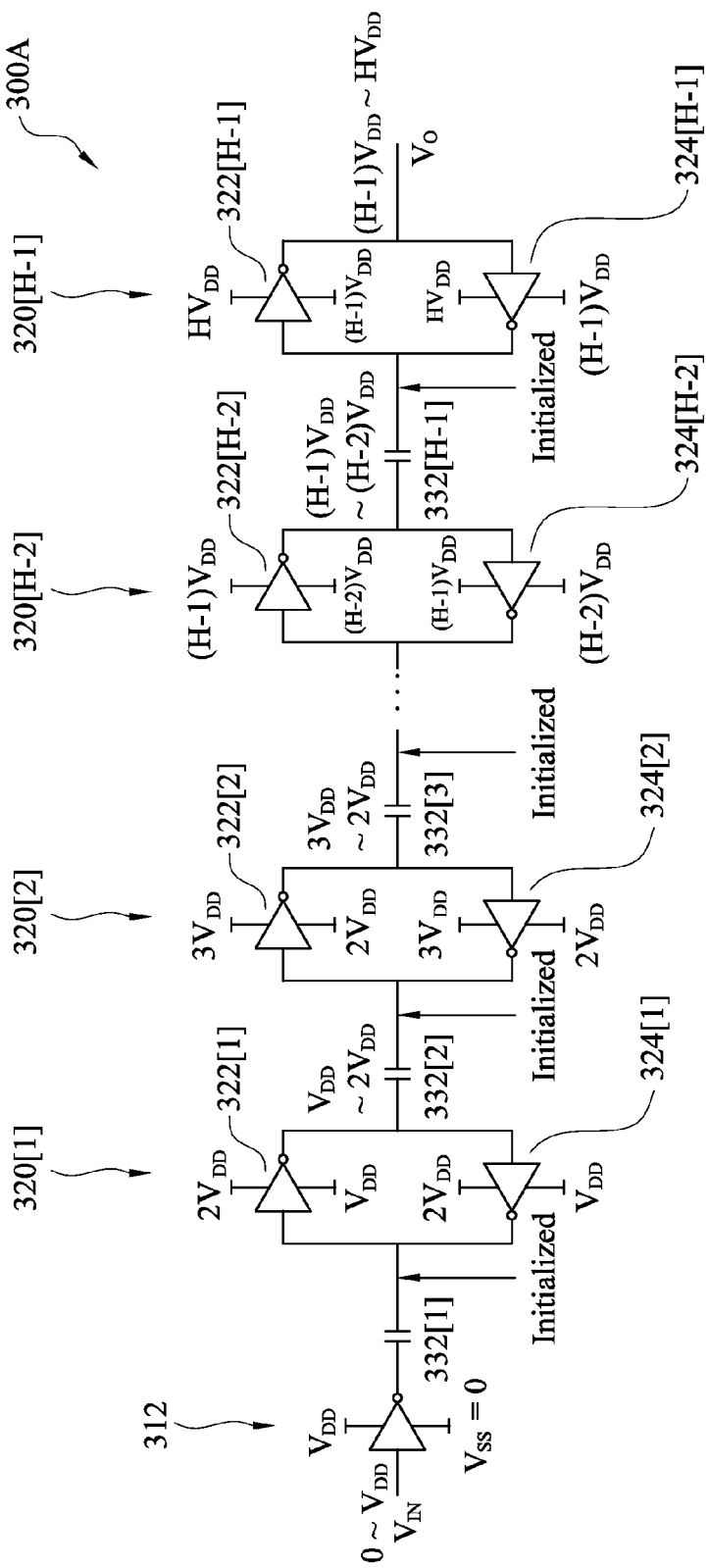
FIGURE 3A (H = EVEN)

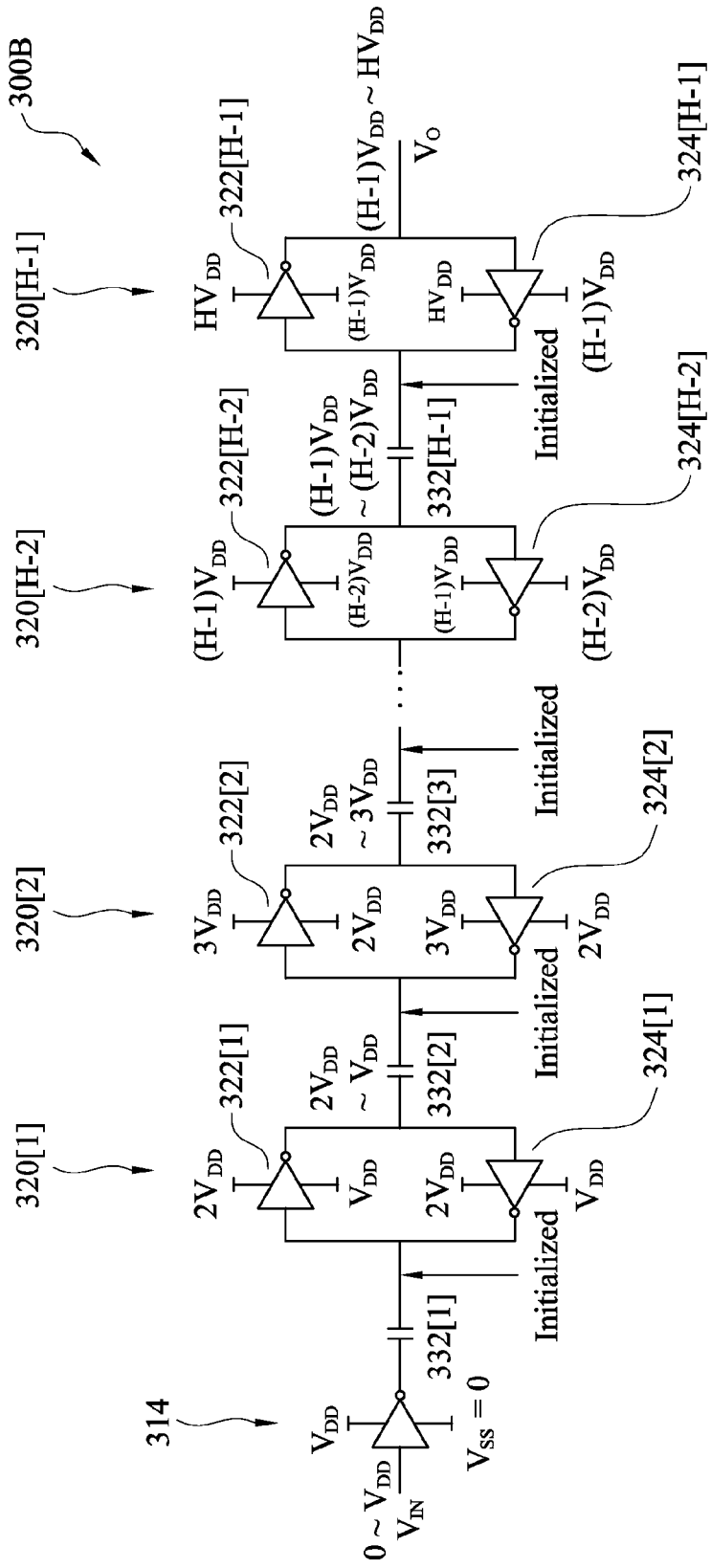
FIGURE 3B  (H = ODD)

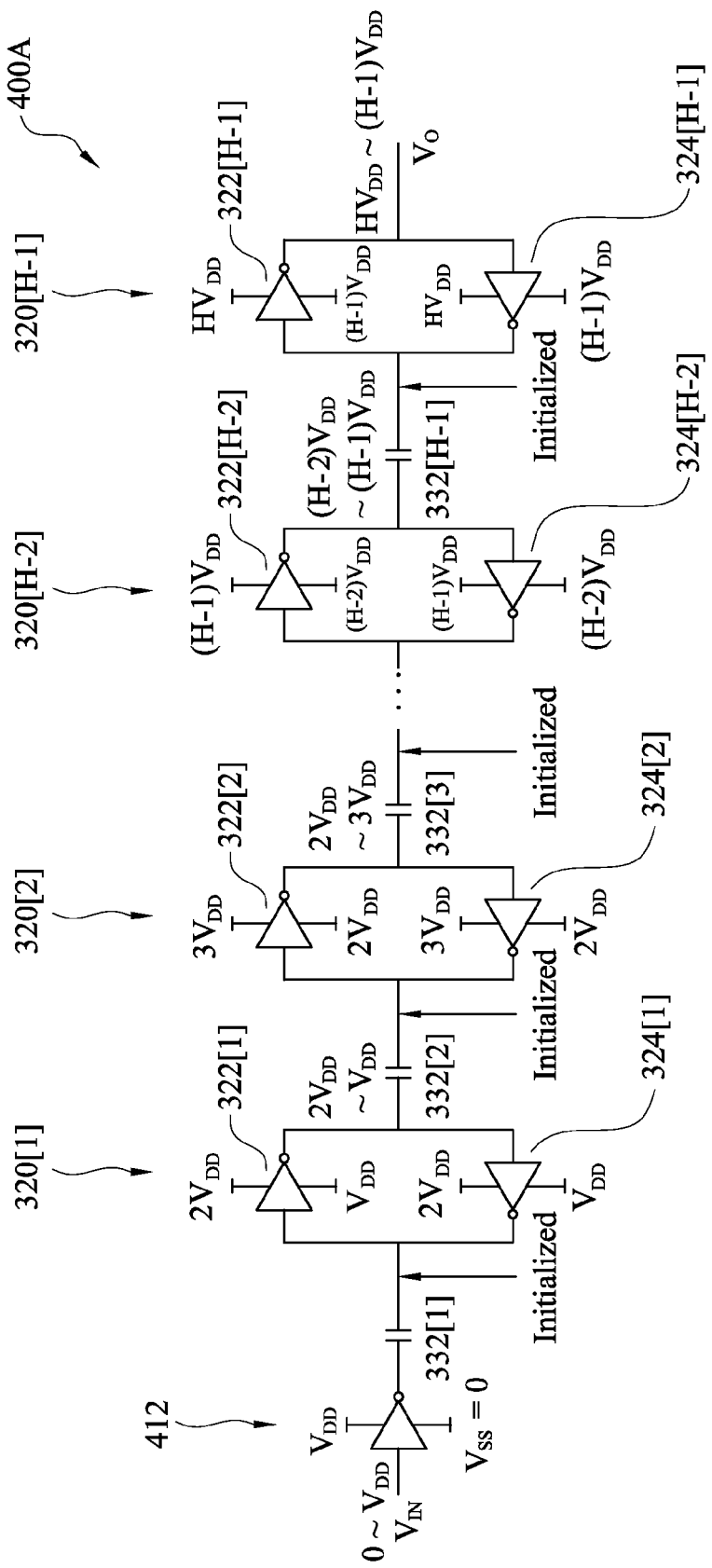
FIGURE 4A (H = EVEN)

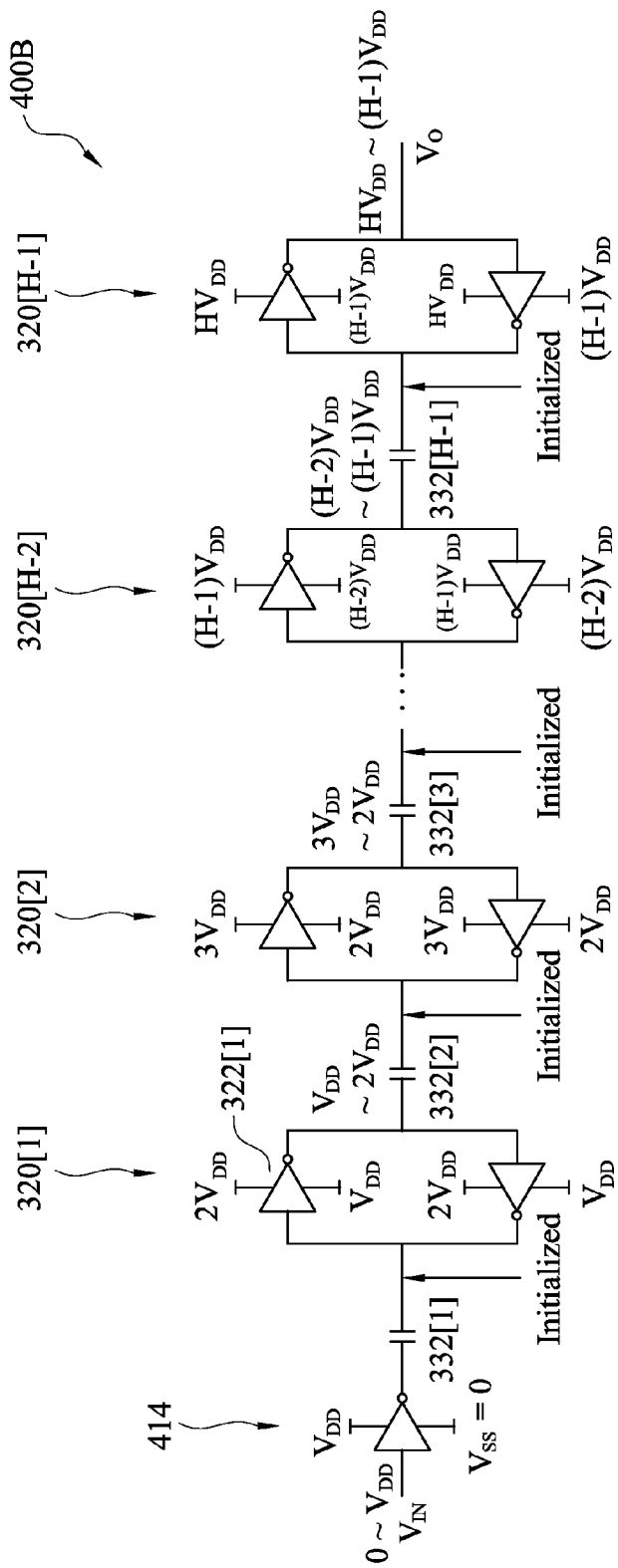
FIGURE 4B (H = ODD)

US 9,559,686 B2

INPUT/OUTPUT CIRCUIT

PRIORITY CLAIM

The present application is a continuation of U.S. application Ser. No. 14/189,653, filed Feb. 25, 2014, now U.S. Pat. No. 9,214,933, issued Dec. 15, 2015, which is incorporated herein by reference in its entirety.

BACKGROUND

As semiconductor technology develops, an integrated circuit sometimes has a signal operating at a voltage swing lower than that of a signal suitable for an external circuit, such as another integrated circuit or one or more discrete electrical components. An input/output (I/O) circuit is often used in the integrated circuit in order to convert the low voltage swing signal from the integrated circuit to a high voltage swing signal recognizable by the external circuit. In some applications, the integrated circuit includes low voltage transistors and high voltage transistors. Low voltage transistors are sometimes also referred to as core (or thin-gate) transistors and are configured to handle the low voltage swing signal. High voltage transistors are sometimes also referred to as I/O (or thick-gate) devices and are configured to handle the large voltage swing signal. Core transistors are designed to be sufficiently large to handle the low voltage swing signal, but are usually not large enough to handle the large voltage swing signal. On the other hand, compared with low-voltage transistors, I/O transistors are usually larger and occupy a larger die space.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A and FIG. 3B are circuit diagrams of various level-shifting circuits in accordance with some embodiments.

FIG. 4A and FIG. 4B are circuit diagrams of various level-shifting circuits in accordance with some embodiments.

DETAILED DESCRIPTION

Figure 1:
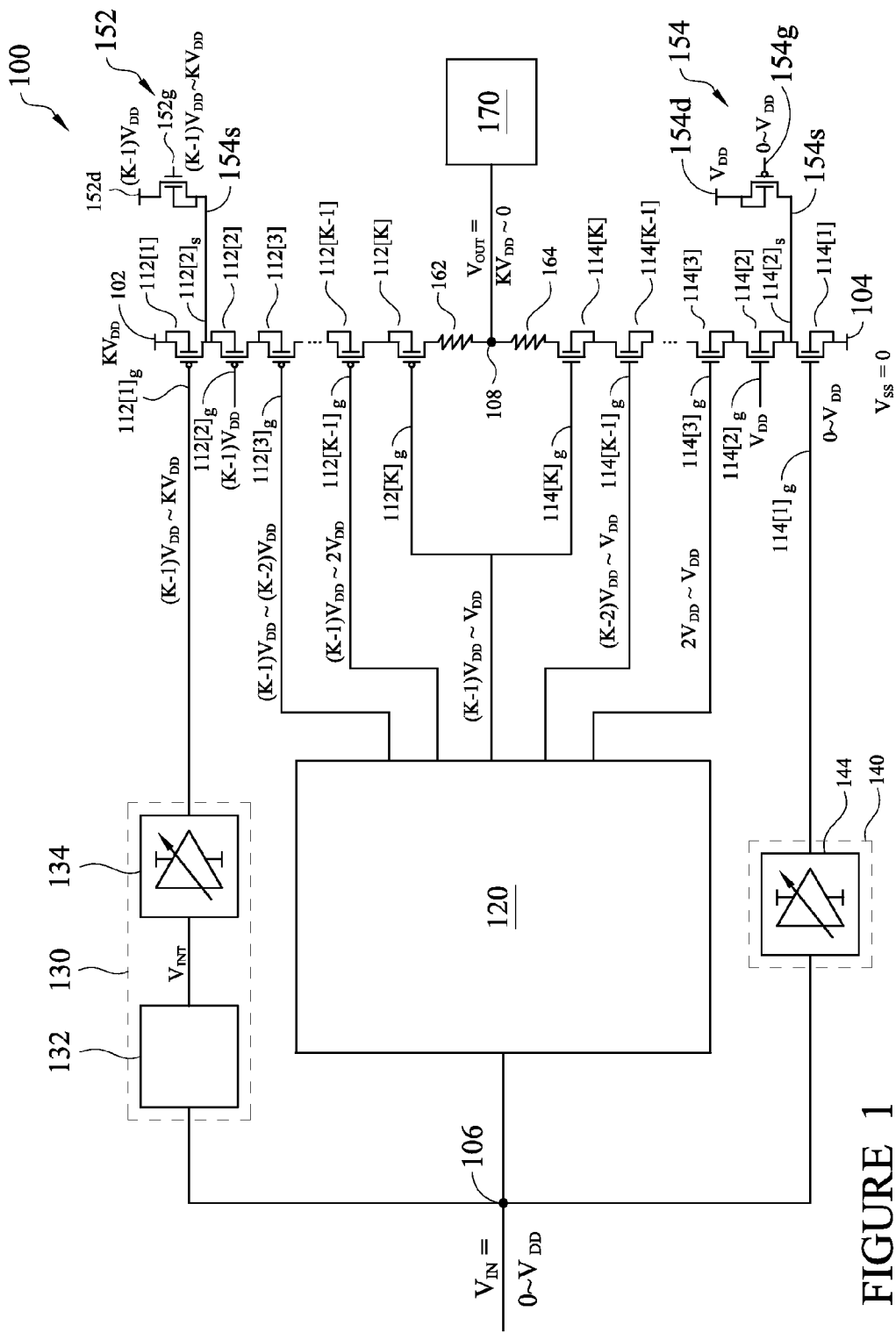
FIG. 1 is a circuit diagram of an I/O circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In accordance with one or more embodiments, an I/O circuit includes cascode transistors as a post-driver stage of the I/O circuit. The cascode transistors are biased in a manner that an absolute value of a source-gate voltage and a drain-gate voltage (for a P-type transistor) or an absolute value of a gate-source voltage and gate-drain voltage (for an N-type transistor) is equal to or less than power supply voltage $V_{DD}$ for low-voltage devices. Therefore, the cascode transistors or the entire I/O circuit is suitable to be implemented using low-voltage transistors and free from having I/O transistors.

FIG. 1 is a circuit diagram of an I/O circuit 100 in accordance with some embodiments. I/O circuit 100 includes a first power node 102, a second power node 104, an input node 106, and an output node 108. First power node 102 is configured to carry a first voltage having a voltage level $K \cdot V_{DD}$ above a zero reference level (i.e., 0 volt for circuit 100). Second power node 104 is configured to carry a second voltage having a voltage level $V_{SS}$, which is used as the zero reference level for circuit 100.

$V_{DD}$ is a predetermined, positive value. In some embodiments, $V_{DD}$ ranges from 0.65 Volts (V) to 1.20 V. K is a positive integer equal to or greater than 3.

Circuit 100 is configured to receive an input signal $V_{IN}$ at input node 106 and to generate an output signal $V_{OUT}$ at output node 108. Input signal $V_{IN}$ is a logic signal usable to indicate a logic low value when input signal $V_{IN}$ is set at the zero reference level and to indicate a logic high value when input signal $V_{IN}$ is set at $V_{DD}$. Output signal $V_{OUT}$ is a logic signal usable to indicate a logic high value ($K \cdot V_{DD}$) when input signal $V_{IN}$ is set at the zero reference level and to indicate a logic low value (the zero reference level) when input signal $V_{IN}$ is set at $V_{DD}$. In FIG. 1, output signal $V_{OUT}$ is logically complementary to input signal $V_{IN}$ and time-shifted by a time delay attributable to the operation of circuit 100.

Circuit 100 further includes K P-type transistors 112[1]~112[K] serially coupled between first power node 102 and output node 108. Each of the K P-type transistors 112[i] is denoted as an i-th transistor of the K P-type transistors, where i is an order index ranging from 1 to K, and a smaller order index i being used to denote a transistor closer to first power node 102.

A gate 112[1]g of the first P-type transistor 112[1] (i.e., when i=1) is configured to receive a signal that is set at $(K-1) \cdot V_{DD}$ after input signal $V_{IN}$ is set at the zero reference level, and is set at $K \cdot V_{DD}$ after input signal $V_{IN}$ is set at $V_{DD}$. A gate 112[2]g of the second P-type transistor 112[2] (i.e., when i=2) is configured to receive a signal that is set at $(K-1) \cdot V_{DD}$. One or more gates 112[3]g~112[K]g of P-type transistors 112[3]~112[K] (i.e., when i≠1 or 2) are configured to receive a set of biasing signals that is set in a manner that an absolute value of a source-gate voltage and a drain-gate voltage of the i-th P-type transistor is equal to or less than $V_{DD}$.

In some embodiments, the set of biasing signals for gates $112[3]g$~$112[K]g$ is set at $(K-1) \cdot V_{DD}$ after input signal $V_{IN}$ is set at the zero reference level (also being referred to as $V_{IN}=0$ in this disclosure), and is set at $(K-i+1) \cdot V_{DD}$ after input signal $V_{IN}$ is set at $V_{DD}$ (also being referred to as $V_{IN}=V_{DD}$ in this disclosure). For example, gate $112[3]g$ of transistor $112[3]$ is biased at $(K-1) \cdot V_{DD}$ ($V_{IN}=0$) or $(K-2) \cdot V_{DD}$ ($V_{IN}=V_{DD}$); gate $112[K-1]g$ of transistor $112[K-1]$ is biased at $(K-1) \cdot V_{DD}$ ($V_{IN}=0$) or $2 \cdot V_{DD}$ ($V_{IN}=V_{DD}$); and gate $112[K]g$ of transistor $112[K]$ is biased at $(K-1) \cdot V_{DD}$ ($V_{IN}=0$) or $V_{DD}$ ($V_{IN}=V_{DD}$).

Circuit 100 further includes K N-type transistors 114[1]~114[K] serially coupled between second power node 104 and output node 108. Each of the K N-type transistors 114[j] is denoted as a j-th transistor of the K N-type transistors, where j is an order index ranging from 1 to K, and a smaller order index j being used to denote a transistor closer to second power node 104.

A gate 114[1]$g$ of the first N-type transistor 114[1] (i.e., when j=1) is configured to receive a signal that is set at the zero reference level after input signal $V_{IN}$ is set at the zero reference level, and is set at $V_{DD}$ after input signal $V_{IN}$ is set at $V_{DD}$. A gate 114[2]$g$ of the second N-type transistor 114[2] (i.e., when j=2) is configured to receive a signal that is set at $V_{DD}$. One or more gates 114[3]$g$~114[K]$g$ of N-type transistors 114[3]~114[K] (i.e., when j≠1 or 2) are configured to receive a set of biasing signals that is set in a manner that an absolute value of a gate-source voltage and a gate-drain voltage of the j-th N-type transistor is equal to or less than $V_{DD}$.

In some embodiments, the set of biasing signals for gates 114[3]$g$~114[K]$g$ is set at $(j-1) \cdot V_{DD}$ after input signal $V_{IN}$ is set at the zero reference level, and is set at $V_{DD}$ after input signal $V_{IN}$ is set at $V_{DD}$. For example, gate 114[3]$g$ of transistor 114[3] is biased at $2 \cdot V_{DD}$ ($V_{IN}=0$) or $V_{DD}$ ($V_{IN}=V_{DD}$); gate 114[K-1]$g$ of transistor 114[K-1] is biased at $(K-2) \cdot V_{DD}$ ($V_{IN}=0$) or $V_{DD}$ ($V_{IN}=V_{DD}$); and gate 114[K]$g$ of transistor 114[K] is biased at $(K-1) \cdot V_{DD}$ ($V_{IN}=0$) or $V_{DD}$ ($V_{IN}=V_{DD}$).

In some embodiments, the K P-type transistors 112[1]~112[K] and the K N-type transistors 114[1]~114[K] are all low-voltage transistors. In some embodiments, low-voltage transistors are considered to be electrically overstressed when an absolute value of a gate-source voltage and a gate-drain voltage is significantly greater than $V_{DD}$ (e.g. >$1.4 \cdot V_{DD}$).

Moreover, circuit 100 includes control signal generation units 120, 130, and 140, parking circuits 152 and 154, resistive devices 162 and 164, and an output pad module 170.

Control signal generation unit 120 is between input node 106 and one or more gates 112[3]$g$~112[K]$g$ and 114[3]$g$~114[K]$g$. Control signal generation unit 120 is configured to generate the set of biasing signals for gates 112[3]$g$~112[K]$g$ and the set of biasing signals for gates 114[3]$g$~114[K]$g$ responsive to input signal $V_{IN}$. Details regarding control signal generation unit 120 is further illustrated in conjunction with FIG. 2.

Control signal generation unit 130 is between input node 106 and gate 112[1]$g$ of transistor 112[1]. Control signal generation unit 130 is configured to generate a control signal to be fed to gate 112[1]$g$ responsive to input signal $V_{IN}$. Control signal generation unit 130 includes a level shifter 132 and a delay unit 134. Level shifter 132 is configured to generate an intermediate signal $V_{INT}$ by up-shifting input signal by $(K-1) \cdot VDD$. Details regarding level shifter 132 is further illustrated in conjunction with FIGS. 3A~3B.

Delay unit 134 is configured to generate the control signal to be fed to gate 112[1]$g$ by delaying the intermediate signal $V_{INT}$. Delay unit 134 is usable to synchronize the timing of transitions of the bias voltage for transistor 112[1]$g$ and other bias voltages for transistors 112[3]~112[K], 114[1], and 114[3]~114[K], responsive to the transition of input signal $V_{IN}$ from one logic value to the other. In some embodiments, the delay period of delay unit 134 is tunable according to one or more control signals, either in an analog or digital format. In some embodiments, the delay period of delay unit 134 is predetermined and fixed when delay unit 134 is fabricated.

Control signal generation unit 140 is between input node 106 and gate 114[1]$g$ of transistor 114[1]. Control signal generation unit 140 is configured to generate a control signal to be fed to gate 114[1]$g$ responsive to input signal $V_{IN}$. Control signal generation unit 140 includes a delay unit 144 configured to generate the control signal to be fed to gate 114[1]$g$ by delaying the input signal $V_{IN}$. Delay unit 144 is also usable to synchronize the timing of transitions of the bias voltage for transistor 114[1]$g$ and other bias voltages for transistors 112[1], 112[3]~112[K], and 114[3]~114[K], responsive to the transition of input signal $V_{IN}$ from one logic value to the other. In some embodiments, the delay period of delay unit 144 is tunable according to one or more control signals, either in an analog or digital format. In some embodiments, the delay period of delay unit 144 is predetermined and fixed when delay unit 144 is fabricated.

Parking circuit 152 is coupled to the source 112[2]$s$ of the second P-type transistor 112[2]. Parking circuit 152 is configured to set the source 112[2]$s$ of the second P-type transistor 112[2] at $(K-1) \cdot V_{DD}$ after the input signal $V_{IN}$ is set at $V_{DD}$. In some embodiments, parking circuit 152 includes an N-type transistor having a source 152$s$ coupled to the source 112[2]$s$ of transistor 112[2], a drain 152$d$ biased at $(K-1) \cdot V_{DD}$, and a gate 152$g$. Gate 152$g$ of parking circuit 152 is set at $K \cdot V_{DD}$ after the input signal $V_{IN}$ is set at $V_{DD}$, and is set at $(K-1) \cdot V_{DD}$ after the input signal $V_{IN}$ is set at the zero reference level. In some embodiments, parking circuit 152 is omitted.

Parking circuit 154 is coupled to the source 114[2]$s$ of the second N-type transistor 114[2]. Parking circuit 154 is configured to set the source 114[2]$s$ of the second N-type transistor 114[2] at $V_{DD}$ after the input signal $V_{IN}$ is set at the zero reference level. In some embodiments, parking circuit 154 includes a P-type transistor having a source 154$s$ coupled to the source 114[2]$s$ of transistor 114[2], a drain 154$d$ biased at $V_{DD}$, and a gate 154$g$. Gate 154$g$ of parking circuit 154 is set at the zero reference level after the input signal $V_{IN}$ is set at the zero reference level, and is set at $V_{DD}$ after the input signal $V_{IN}$ is set at $V_{DD}$. In some embodiments, parking circuit 154 is omitted.

Resistive device 162 is between the transistor 112[K] and output node 108. Resistive device 164 is between the transistor 114[K] and output node 108. Resistive devices 162 and 164 are configured to set an output impedance of circuit 100 at a predetermined resistance value for matching the characteristic impedance of a transmission line to which output node 108 is coupled. Output pad module 170 includes an conductive pad usable to connected output node 108 with an external circuit. In some embodiments, output pad module 170 also includes electrical statistic discharge (ESD) protection circuit to protect I/O circuit 100 or a logic circuit that outputs the input signal $V_{IN}$ to I/O circuit 100.

In FIG. 1, when input signal $V_{IN}$ is set at the zero reference level, control signal generation units 120 and 130 set gates 112[1]g and 112[3]g~112[K]g at $(K-1) \cdot V_{DD}$. Gate 112[2]g is also biased at $(K-1) \cdot V_{DD}$. Transistors 112[1]~112[K] are turned on and electrically coupling output node 108 with power node 102, and thus the voltage level at output node 108 is pulled toward $K \cdot V_{DD}$ through transistors 112[1]~112[K]. Meanwhile, gate 152g of parking circuit 152 is biased at $(K-1) \cdot V_{DD}$, and parking circuit 152 is turned off to electrically decouple source 112[2]s from drain 152d of parking circuit 152.

Meanwhile, when input signal $V_{IN}$ is set at the zero reference level, transistors 114[1]~114[K] are configured to be turned off but still function as a voltage divider due to sub-threshold currents. In some embodiments, a drain of a j-th transistor 114[j] is at about $j \cdot V_{DD}$. Control signal generation unit 140 sets gate 114[1]g at the zero reference level to turn off transistor 114[1]. Also, gate 154g of parking circuit 154 is biased at the zero reference level, and parking circuit 154 is turned on to electrically couple source 114[2]s with drain 154d of parking circuit 154 and thus set source 114[2]s at $V_{DD}$. Gate 114[2]g of transistor 114[2] is set at $V_{DD}$ to limit a maximum voltage at source 114[2]s to $V_{DD}$ since transistor 114[2] will be turned off when voltage at 114[2]s rises significantly close to $V_{DD}$. Control signal generation unit 120 further sets gate 114[j]g at $(j-1) \cdot V_{DD}$, j=3~K, to limit a maximum voltage at source 114[j]s of transistors 114[3]~114[K] to $(j-1) \cdot V_{DD}$ for the same reason.

On the other hand, when input signal $V_{IN}$ is set at $V_{DD}$, control signal generation units 120 and 140 set gates 114[1]g and 114[3]g~114[K]g at $V_{DD}$. Gate 114[2]g is also biased at $V_{DD}$. Transistors 114[1]~114[K] are turned on and electrically coupling output node 108 with power node 104, and thus the voltage level at output node 108 is pulled toward the zero reference level through transistors 114[1]~114[K]. Meanwhile, gate 154g of parking circuit 154 is biased at $V_{DD}$, and parking circuit 154 is turned off to electrically decouple source 114[2]s from drain 154d of parking circuit 154.

Meanwhile, when input signal $V_{IN}$ is set at $V_{DD}$, transistors 112[1]~112[K] are configured to be turned off but still function as a voltage divider due to sub-threshold currents. In some embodiments, a drain of a i-th transistor 112[i] is at about $(K-i) \cdot V_{DD}$. Control signal generation unit 140 sets gate 112[1]g at $K \cdot V_{DD}$ to turn off transistor 112[1]. Also, gate 152g of parking circuit 152 is biased at $K \cdot V_{DD}$, and parking circuit 152 is turned on to electrically couple source 112[2]s with drain 152d of parking circuit 152 and thus set source 112[2]s at $(K-1) \cdot V_{DD}$. Gate 112[2]g of transistor 112[2] is set at $(K-1) \cdot V_{DD}$ to limit a minimum voltage at source 112[2]s to $(K-1) \cdot V_{DD}$ since transistor 112[2] will be turned off when voltage at 112[2]s falls significantly close to $(K-1) \cdot V_{DD}$. Control signal generation unit 120 further sets gate 112[i]g at $(K-i+1) \cdot V_{DD}$, i=3~K, to limit a minimum voltage at source 112[i]s of transistors 112[3]~112[K] to $(K-i+1) \cdot V_{DD}$ for the same reason.

Figure 2:
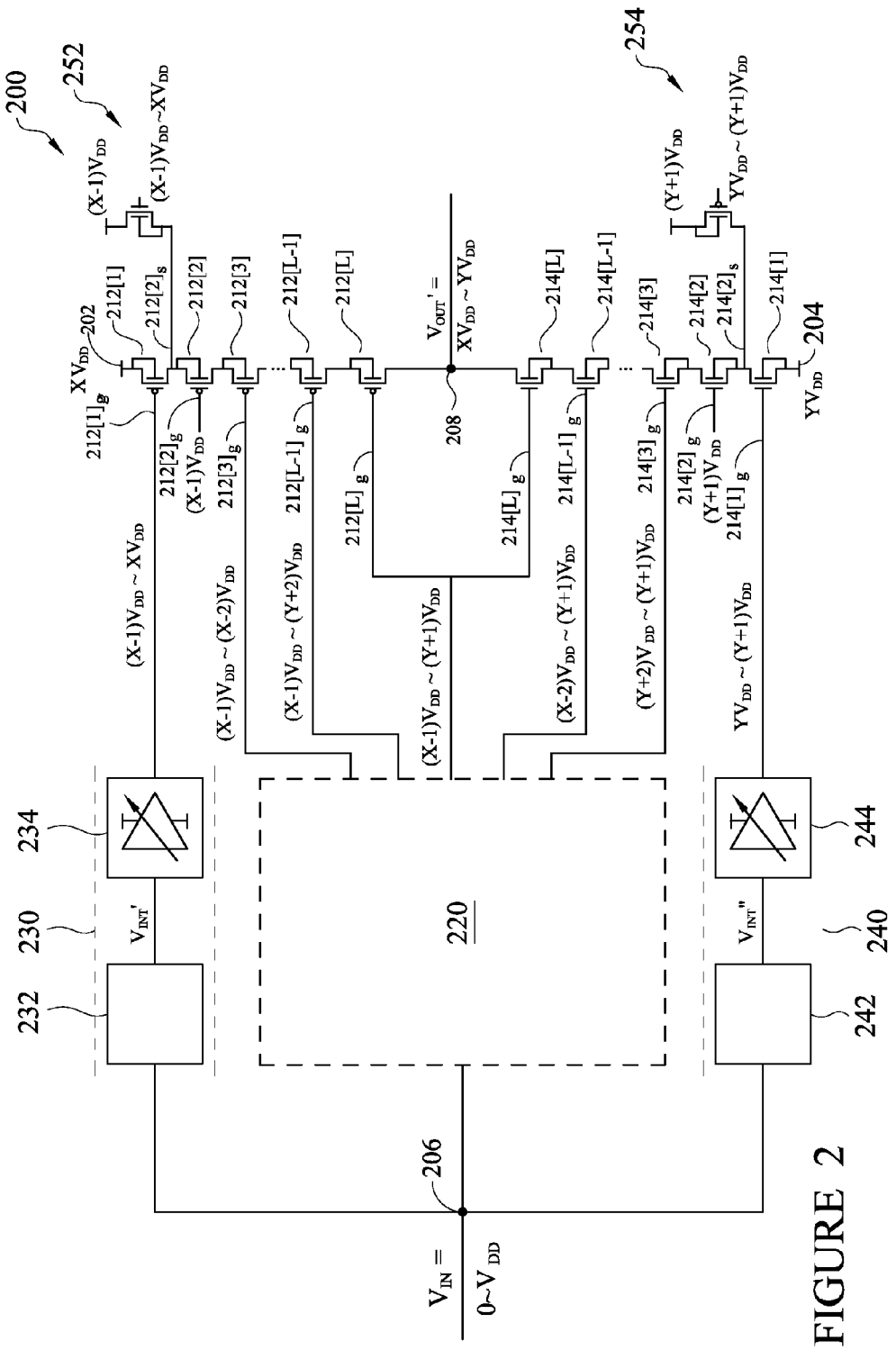
FIG. 2 is a circuit diagram of a driver circuit in accordance with some embodiments.

FIG. 2 is a circuit diagram of a driver circuit 200 in accordance with some embodiments. Driver circuit 200 is usable as part of control signal generation unit 120. The output signal $V_{OUT}'$ of driver circuit 200 is set at $X \cdot V_{DD}$ after the input signal $V_{IN}$ is set at the zero reference level, and is set at $Y \cdot V_{DD}$ after the input signal $V_{IN}$ is set at $V_{DD}$, where X and Y are positive integers, (X−Y)=L, and L>2.

Driver circuit 200 includes a third power node 202, a fourth power node 204, an input node 206, and an output node 208. Third power node 202 is configured to carry a third voltage having a voltage level $X \cdot V_{DD}$. Fourth power node 204 is configured to carry a fourth voltage having a voltage level $Y \cdot V_{DD}$. Input node 206 is electrically coupled with input node 106 (FIG. 1). Output node 208 is electrically coupled with one of gates 112[3]~112[K] or one of gates 114[3]~114[K]. In some embodiments, output signal $V_{OUT}'$ is also a logic signal usable to indicate a logic high value $(X \cdot V_{DD})$ when input signal $V_{IN}$ is set at the zero reference level and to indicate a logic low value $(Y \cdot V_{DD})$ when input signal $V_{IN}$ is set at $V_{DD}$.

Driver circuit 200 has a configuration similar to that of I/O circuit 100. Driver circuit 200 includes L P-type transistors 212[1]~212[L] serially coupled between power node 202 and output node 208. Driver circuit 200 also includes L N-type transistors 214[1]~214[L] serially coupled between power node 204 and output node 208.

Each of the L P-type transistors 212[s] is denoted as an s-th transistor of the L P-type transistors, where s is an order index ranging from 1 to L, and a smaller order index s being used to denote a transistor closer to power node 202. Each of the L N-type transistors 214[t] is denoted as a t-th transistor of the L N-type transistors, where t is an order index ranging from 1 to L, and a smaller order index t being used to denote a transistor closer to power node 204.

A gate 212[1]g of the first P-type transistor 212[1] (i.e., when s=1) is configured to receive a signal that is set at $(X-1) \cdot V_{DD}$ after input signal $V_{IN}$ is set at the zero reference level and is set at $X \cdot V_{DD}$ after input signal $V_{IN}$ is set at $V_{DD}$. A gate 212[2]g of the second P-type transistor 212[2] (i.e., when s=2) is configured to receive a signal that is set at $(X-1) \cdot V_{DD}$. One or more gates 212[3]g~212[L]g of P-type transistors 212[3]~212[L] (i.e., when s≠1 or 2) are configured to receive a set of biasing signals that is set in a manner that an absolute value of a source-gate voltage and a drain-gate voltage of the s-th transistor is equal to or less than $V_{DD}$.

In some embodiments, the set of biasing signals for gates 212[3]g~212[L]g is set at $(X-1) \cdot V_{DD}$ after input signal $V_{IN}$ is set at the zero reference level ($V_{IN}=0$) and is set at $(X-s+1) \cdot V_{DD}$ after input signal $V_{IN}$ is set at $V_{DD}$ ($V_{IN}=V_{DD}$). For example, gate 212[3]g of transistor 212[3] is biased at $(X-1) \cdot V_{DD}$ ($V_{IN}=0$) or $(X-2) \cdot V_{DD}$ ($V_{IN}=V_{DD}$); gate 212[L-1]g of transistor 212[L-1] is biased at $(X-1) \cdot V_{DD}$ ($V_{IN}=0$) or $(Y+2) \cdot V_{DD}$ ($V_{IN}=V_{DD}$); and gate 212[L]g of transistor 212[L] is biased at $(X-1) \cdot V_{DD}$ ($V_{IN}=0$) or $(Y+1) \cdot V_{DD}$ ($V_{IN}=V_{DD}$).

A gate 214[1]g of the first N-type transistor 214[1] (i.e., when t=1) is configured to receive a signal that is set at $Y \cdot V_{DD}$ after input signal $V_{IN}$ is set at the zero reference level and is set at $(Y+1) \cdot V_{DD}$ after input signal $V_{IN}$ is set at $V_{DD}$. A gate 214[2]g of the second N-type transistor 214[2] (i.e., when t=2) is configured to receive a signal that is set at $(Y+1) \cdot V_{DD}$. One or more gates 214[3]g~214[L]g of N-type transistors 214[3]~214[L] (i.e., when t≠1 or 2) are configured to receive a set of biasing signals that is set in a manner that an absolute value of a gate-source voltage and a gate-drain voltage of the t-th transistor is equal to or less than $V_{DD}$.

In some embodiments, the set of biasing signals for gates 214[3]g~214[L]g is set at $(Y+t-1) \cdot V_{DD}$ after input signal $V_{IN}$ is set at the zero reference level and is set at $(Y+1) \cdot V_{DD}$ after input signal $V_{IN}$ is set at $V_{DD}$. For example, gate 214[3]g of transistor 214[3] is biased at $(Y+2) \cdot V_{DD}$ ($V_{IN}=0$) or $(Y+1) \cdot V_{DD}$ ($V_{IN}=V_{DD}$); gate 214[L-1]g of transistor 114[L-1] is biased at $(X-2) \cdot V_{DD}$ ($V_{IN}=0$) or $(Y+1) \cdot V_{DD}$ ($V_{IN}=V_{DD}$); and gate 214[L]g of transistor 214[L] is biased at $(X-1) \cdot V_{DD}$ ($V_{IN}=0$) or $(Y+1) \cdot V_{DD}$ ($V_{IN}=V_{DD}$).

In some embodiments, the L P-type transistors 212[1]~212[L] and the L N-type transistors 214[1]~214[L] are all low-voltage transistors.

Moreover, circuit 200 includes control signal generation units 220, 230, and 240 and parking circuits 252 and 254.

Control signal generation unit 220 is between input node 206 and one or more gates 212[3]g~212[L]g and 214[3]g~214[L]g. Control signal generation unit 220 is configured to generate the set of biasing signals for gates 212[3]g~212[L]g and the set of biasing signals for gates 214[3]g~214[L]g. In some embodiments, when L is 2, control signal generation unit 220 is omitted. In some embodiments, when L is greater than 2, control signal generation unit 220 includes one or more other driver circuit having a configuration similar to driver circuit 200.

Control signal generation unit 230 is between input node 206 and gate 212[1]g of transistor 212[1]. Control signal generation unit 230 has a configuration similar to control signal generation unit 130 and is configured to generate a control signal to be fed to gate 212[1]g responsive to input signal $V_{IN}$. Control signal generation unit 230 includes a level shifter 232 and a delay unit 234. Level shifter 232 is configured to generate an intermediate signal $V_{INT}'$ by up-shifting input signal by $(X-1) \cdot VDD$. Details regarding level shifter 232 is further illustrated in conjunction with FIGS. 3A~3B.

Delay unit 234 is configured to generate the control signal to be fed to gate 212[1]g by delaying the intermediate signal $V_{INT}'$. Delay unit 234 is usable to synchronize the timing of transitions of the bias voltage for transistor 212[1]g and other bias voltages for transistors 212[3]~212[L], 214[1], and 214[3]~214[L], responsive to the transition of input signal $V_{IN}$ from one logic value to the other. Also, delay unit 234 is set to synchronize the timing of transitions of the output signal $V_{OUT}'$ and other bias voltages for transistors 112[1], 112[3]~112[K], 114[1], or 114[3]~114[K] of I/O circuit 100. In some embodiments, the delay period of delay unit 234 is tunable according to one or more control signals, either in analog or digital format. In some embodiments, the delay period of delay unit 234 is predetermined and fixed when delay unit 234 is fabricated.

Control signal generation unit 240 is between input node 206 and gate 214[1]g of transistor 214[1]. Control signal generation unit 240 has a configuration similar to control signal generation unit 230 and is configured to generate a control signal to be fed to gate 214[1]g responsive to input signal $V_{IN}$. Control signal generation unit 240 includes a level shifter 242 and a delay unit 244. Level shifter 242 is configured to generate an intermediate signal $V_{INT}''$ by up-shifting input signal by $Y \cdot VDD$. Details regarding level shifter 242 is further illustrated in conjunction with FIGS. 4A~4B.

Delay unit 244 is configured to generate the control signal to be fed to gate 214[1]g by delaying the intermediate signal $V_{INT}''$. Delay unit 244 is usable to synchronize the timing of transitions of the bias voltage for transistor 214[1]g and other bias voltages for transistors 212[1], 212[3]~212[L], and 214[3]~214[L], responsive to the transition of input signal $V_{IN}$ from one logic value to the other. Also, delay unit 244 is set to synchronize the timing of transitions the output signal $V_{OUT}'$ and other bias voltages for transistors 112[1], 112[3]~112[K], 114[1], or 114[3]~114[K] of I/O circuit 100. In some embodiments, the delay period of delay unit 244 is tunable according to one or more control signals, either in analog or digital format. In some embodiments, the delay period of delay unit 244 is predetermined and fixed when delay unit 244 is fabricated.

Parking circuit 252 is coupled to the source 212[2]s of the second P-type transistor 212[2]. Parking circuit 252 is configured to set the source 212[2]s of the second P-type transistor 212[2] at $(X-1) \cdot V_{DD}$ after the input signal $V_{IN}$ is set at $V_{DD}$. In some embodiments, parking circuit 252 includes an N-type transistor having a source 252s coupled to the source 212[2]s of transistor 212[2], a drain 252d biased at $(X-1) \cdot V_{DD}$, and a gate 252g. Gate 252g of parking circuit 252 is set at $(X-1) \cdot V_{DD}$ after the input signal $V_{IN}$ is set at the zero reference level and at $X \cdot V_{DD}$ after the input signal $V_{IN}$ is set at $V_{DD}$. In some embodiments, parking circuit 252 is omitted.

Parking circuit 254 is coupled to the source 214[2]s of the second N-type transistor 214[2]. Parking circuit 254 is configured to set the source 214[2]s of the second N-type transistor 214[2] at $(Y+1) \cdot V_{DD}$ after the input signal $V_{IN}$ is set at the zero reference level. In some embodiments, parking circuit 254 includes a P-type transistor having a source 254s coupled to the source 214[2]s of transistor 214[2], a drain 254d biased at $(Y+1) \cdot V_{DD}$, and a gate 254g. Gate 254g of parking circuit 254 is set at $Y \cdot V_{DD}$ after the input signal $V_{IN}$ is set at the zero reference level and at $(Y+1) \cdot V_{DD}$ after the input signal $V_{IN}$ is set at $V_{DD}$. In some embodiments, parking circuit 254 is omitted.

The operation of driver circuit 200 is similar to the operation of I/O circuit 100 of FIG. 1, and thus the description thereof is omitted. In some embodiments, level-shifting circuits or signal divers other than driver circuit 200 are also usable for implementing a portion of all of control signal generation unit 120.

FIG. 3A is a circuit diagram of a level-shifting circuit 300A in accordance with some embodiments. Level-shifting circuit 300A is configured to up-shifting an input signal $V_{IN}$ having a voltage swing between 0 and $V_{DD}$ to an output signal $V_O$ having corresponding voltage levels of $(H-1) \cdot V_{DD}$ and $H \cdot V_{DD}$. H is a positive, even integer equal to or greater than 2. Level-shifting circuit 300A is usable as level shifter 132 or level shifter 232.

Level-shifting circuit 300A includes an inverter 312, (H−1) latch circuits 320[1]~320[H−1], and capacitive devices 332[1]~332[H−1]. An input end of inverter 312 is configured to receive input signal $V_{IN}$, and an output end of inverter 312 is coupled to one end of capacitive device 332[1]. A latch circuit 320[h], h=1~(H−1), is powered between $h \cdot V_{DD}$ and $(h+1) \cdot V_{DD}$. Each latch circuit 320[1]~320[H−1] has a corresponding first inverter 322[1]~322[H−1] and a corresponding second inverter 324[1]~324[H−1]. Each first inverter 322[1]~322[H−1] has an input end coupled to a corresponding capacitive device 332[1]~332[H−1] and coupled to an output end of the corresponding second inverter 324[1]~324[H−1]. Each second inverter 324[1]~324[H−1] has an input end coupled to an output end of the corresponding first inverter 322[1]~322[H−1]. Also, the input ends of second inverter 324[1]~324[H−2] are coupled to a corresponding capacitive device 332[2]~332[H−1]. Each capacitive device 332[1]~332[H−1] is pre-charged to have a voltage difference $V_{DD}$ between the end indicated by a corresponding arrow labeled as "initialized" and the other end of the capacitive device.

When input signal $V_{IN}$ is set at a logic low value (e.g., 0 V), an output of a first inverter 322[h] when h is an odd number outputs a logic low value (e.g., $h \cdot V_{DD}$) and an output of a first inverter 322[h] when h is an even number outputs a logic high value (e.g., $(h+1) \cdot V_{DD}$). When input signal $V_{IN}$ is set at a logic high value (e.g., $V_{DD}$), an output of a first inverter 322[h] when h is an odd number outputs a logic high value (e.g., $(h+1) \cdot V_{DD}$) and an output of a first inverter 322[h] when h is an even number outputs a logic low value (e.g., h·$V_{DD}$). As such, when H is a positive, even integer, level-shifting circuit 300A is capable of setting output signal $V_O$ at output end of inverter 322[H−1] at (H−1)·$V_{DD}$ (when $V_{IN}$=0) or H·$V_{DD}$ (when $V_{IN}$=$V_{DD}$).

FIG. 3B is a circuit diagram of a level-shifting circuit 300B in accordance with some embodiments. Level-shifting circuit 300B is configured to up-shifting an input signal $V_{IN}$ having a voltage swing between 0 and $V_{DD}$ to an output signal $V_O$ having corresponding voltage levels of (H−1)·$V_{DD}$ and H·$V_{DD}$. H is a positive, odd integer equal to or greater than 3. Level-shifting circuit 300B is usable as level shifter 132 or level shifter 232.

Level-shifting circuit 300B includes a buffer 314, (H−1) latch circuits 320[1]~320[H−1], and capacitive devices 332[1]~332[H−1]. Compared with level-shifting circuit 300A, level-shifting circuit 300B replaces inverter 312 with buffer 314. Operation of level-shifting circuit 300B is similar to that of level-shifting circuit 300A and thus description thereof is omitted.

FIG. 4A is a circuit diagram of a level-shifting circuit 400A in accordance with some embodiments. Level-shifting circuit 400A is configured to up-shifting an input signal $V_{IN}$ having a voltage swing between 0 and $V_{DD}$ to an output signal $V_O$ having corresponding voltage levels of H·$V_{DD}$ and (H−1)·$V_{DD}$. H is a positive, even integer equal to or greater than 2. Level-shifting circuit 400A is usable as level shifter 242.

Level-shifting circuit 400A includes a buffer 412, (H−1) latch circuits 320[1]~320[H−1], and capacitive devices 332[1]~332[H−1]. Compared with level-shifting circuit 300B, level-shifting circuit 400A also has a buffer 412 as input stage but H is set to be an even number. Operation of level-shifting circuit 400A is similar to that of level-shifting circuit 300A and level-shifting circuit 300B and thus description thereof is omitted.

FIG. 4B is a circuit diagram of a level-shifting circuit 400B in accordance with some embodiments. Level-shifting circuit 400B is configured to up-shifting an input signal $V_{IN}$ having a voltage swing between 0 and $V_{DD}$ to an output signal $V_O$ having corresponding voltage levels of H·$V_{DD}$ and (H−1)·$V_{DD}$. H is a positive, odd integer equal to or greater than 3. Level-shifting circuit 400B is usable as level shifter 242.

Level-shifting circuit 400B includes an inverter 414, (H−1) latch circuits 320[1]~320[H−1], and capacitive devices 332[1]~332[H−1]. Compared with level-shifting circuit 300A, level-shifting circuit 400B also has an inverter 414 as input stage but H is set to be an odd number. Operation of level-shifting circuit 400B is similar to that of level-shifting circuit 300A and level-shifting circuit 300B and thus description thereof is omitted.

Figure 5:
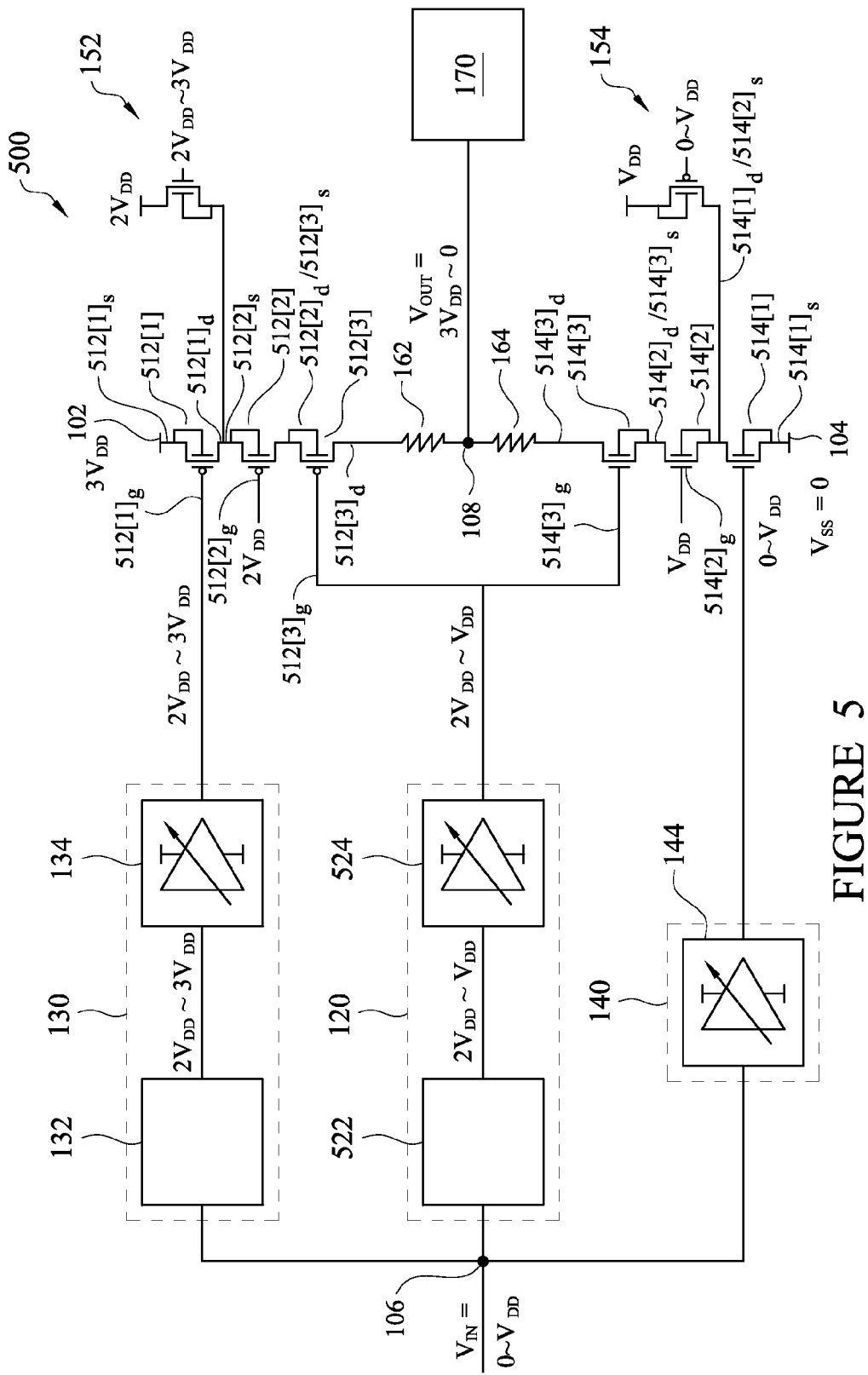
FIG. 5 is a circuit diagram of an I/O circuit in accordance with some embodiments.

FIG. 5 is a circuit diagram of an I/O circuit 500 in accordance with some embodiments. I/O circuit 500 is configured based on I/O circuit 100 when K is set to be 3. Components of I/O circuit 500 that are the same or similar to those of I/O circuit 100 are given the same reference numbers, and description thereof is omitted.

IO circuit 500 has a first P-type transistor 512[1], a second P-type transistor 512[2], a third P-type transistor 512[3], a first N-type transistor 514[1], a second N-type transistor 514[2], and a third N-type transistor 514[3].

First P-type transistor 512[1] has a source 512[1]s coupled to first power node 102, a drain 512[1]d, and a gate 512[1]g configured to receive a signal having a voltage level ranging from 2·$V_{DD}$ to 3·$V_{DD}$. Second P-type transistor 512[2] has a source 512[2]s coupled to the drain 512[1]d of first P-type transistor 512[1]d, a drain 512[2]d, and a gate 512[2]g biased at 2·$V_{DD}$. Third P-type transistor 512[3] has a source 512[3]s coupled to the drain 512[2]d of the second P-type transistor 512[2], a drain 512[3]d, and a gate 512[3]g. The first, second, and third P-type transistors 512[1]~512[3] are configured to pull a voltage level at the output node 108 toward 3·$V_{DD}$ through the drain 512[3]d of the third P-type transistor 512[3] after an input signal $V_{IN}$ is set at the zero reference level.

First N-type transistor 514[1] has a source 514[1]s coupled to the second power node 104, a drain 514[1]d, and a gate 514[1]g configured to receive a signal having a voltage level ranging from the zero reference level to $V_{DD}$. Second N-type transistor 514[2] has a source 514[2]s coupled to the drain 514[1]d of first N-type transistor 514[1], a drain 514[2]d, and a gate 514[2]g biased at $V_{DD}$. Third N-type transistor 514[3] has a source 514[3]s coupled to the drain 514[2]d of second N-type transistor 514[2], a drain 514[3]d, and a gate 514[3]g. The first, second, and third N-type transistors 514[1]~514[3] are configured to pull the voltage level at the output node 108 toward the zero reference level through drain 514[3]d of third N-type transistor 514[3] after the input signal $V_{IN}$ is set at $V_{DD}$.

I/O circuit 500 further includes control signal generation units 120, 130, and 140, parking circuits 152 and 154, resistive devices 162 and 164, and an output pad module 170. Configurations and operations of parking circuits 152 and 154, resistive devices 162 and 164, and an output pad module 170 are similar or the same as those of I/O circuit 100, and thus corresponding description is omitted.

Control signal generation unit 120 is configured to set the voltage level at the gate 512[3]g of the third P-type transistor 512[3] and the voltage level at the gate 514[3]g of the third N-type transistor 514[3] at 2·$V_{DD}$ after the input signal $V_{IN}$ is set at the zero reference level, and at $V_{DD}$ after the input signal is set at $V_{DD}$. Control signal generation unit 120 includes a driver circuit 522 and a delay unit 524. In some embodiments, driver circuit 522 is implemented based on level-shifting circuit 400A of FIG. 4A, where H is 2.

Control signal generation unit 130 is configured to set the gate 512[1]g of the first P-type transistor 512[1] at 2·$V_{DD}$ after the input signal $V_{IN}$ is set at the zero reference level, and at 3·$V_{DD}$ after the input signal $V_{IN}$ is set at $V_{DD}$. Control signal generation unit 130 includes a level shifter 132 and a delay unit 134. In some embodiments, level shifter 132 is implemented based on level-shifting circuit 300A of FIG. 3A, where H is 2.

Control signal generation unit 140 is configured to set the gate 514[1]g of the first N-type transistor 514[1] at the zero reference level after the input signal $V_{IN}$ is set at the zero reference level, and at $V_{DD}$ after the input signal $V_{IN}$ is set at $V_{DD}$.

Figure 6:
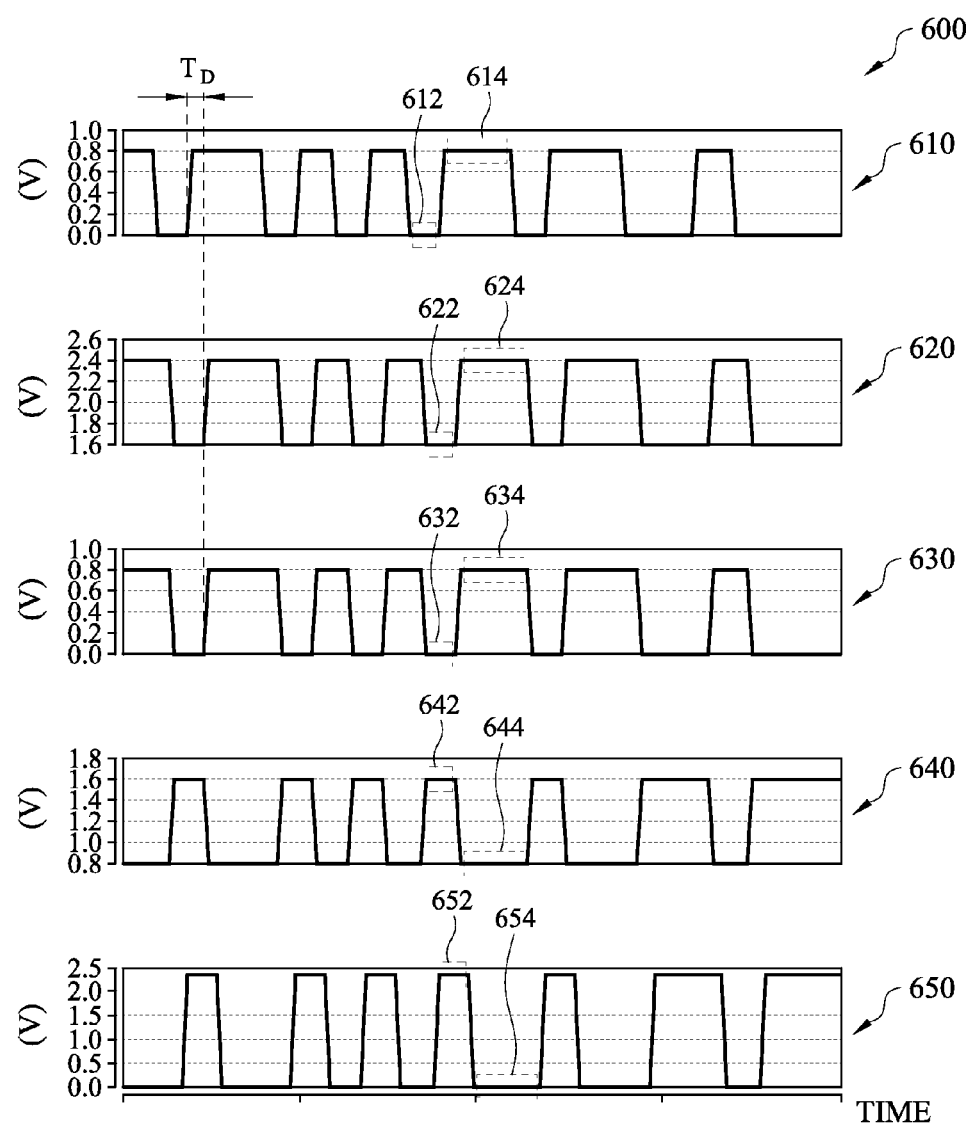
FIG. 6 is a timing diagram of voltage signals at various nodes of an I/O circuit in accordance with some embodiments.

FIG. 6 is a timing diagram 600 of voltage signals at various nodes of an I/O circuit, such as I/O circuit 500, in accordance with some embodiments. In FIG. 6, curve 610 represents input signal $V_{IN}$ at input node 106; curve 620 represents a control signal at gate 512[1]g; curve 630 represents a control signal at gate 514[1]g; curve 640 represents a control signal at gate 512[3]g and gate 514[3]g; and curve 650 represents an output signal $V_{OUT}$ at output node 108. In FIG. 6, $V_{DD}$ is set to be 0.8 V, 2·$V_{DD}$ is 1.6 V, and 3·$V_{DD}$ is 2.4 V.

In response to input signal $V_{IN}$ (curve 610), control signal (curve 620) at gate 512[1]g is up-shifting by 1.6 V and has a predetermined delay $T_D$ behind input signal $V_{IN}$. The delay $T_D$ is attributable to the operation of control signal generation unit 130. Control signal (curve 630) at gate 514[1]g has the predetermined delay $T_D$ behind input signal $V_{IN}$ and has a voltage swing between 0 and 0.8 V. Control signal (curve 640) at gate 512[3]g and gate 514[3]g is up-shifting by 0.8 V and is a logically inverted counterpart of control signals 620 and 630. The transitions of signals 620, 630, and 640 are synchronized by delay units 524, 134, and 144 in FIG. 5.

As depicted in FIG. 6 and FIG. 5, after input signal $V_{IN}$ is set at 0 V (section 612), control signal at gate 512[1]g is set at 1.6 V (section 622), control signal at gate 514[1]g is set at 0 V (section 632), and control signal at gate 512[3]g and 514[3]g is set at 1.6 V (section 642). Meanwhile, gate 512[2]g is set at 1.6 V and gate 514[2]g is set at 0.8 V. As a result, transistors 512[1]~512[3] are turned on and thus pulling output signal VOUT to 2.4V (section 652).

On the other hand, after input signal $V_{IN}$ is set at 0.8 V (section 614), control signal at gate 512[1]g is set at 2.4 V (section 624), control signal at gate 514[1]g is set at 0.8 V (section 634), and control signal at gate 512[3]g and 514[3]g is set at 0.8 V (section 644). Meanwhile, gate 512[2]g is still set at 1.6 V and gate 514[2]g is still set at 0.8 V. As a result, transistors 514[1]~514[3] are turned on and thus pulling output signal VOUT to 0 V (section 654).

Figure 7:
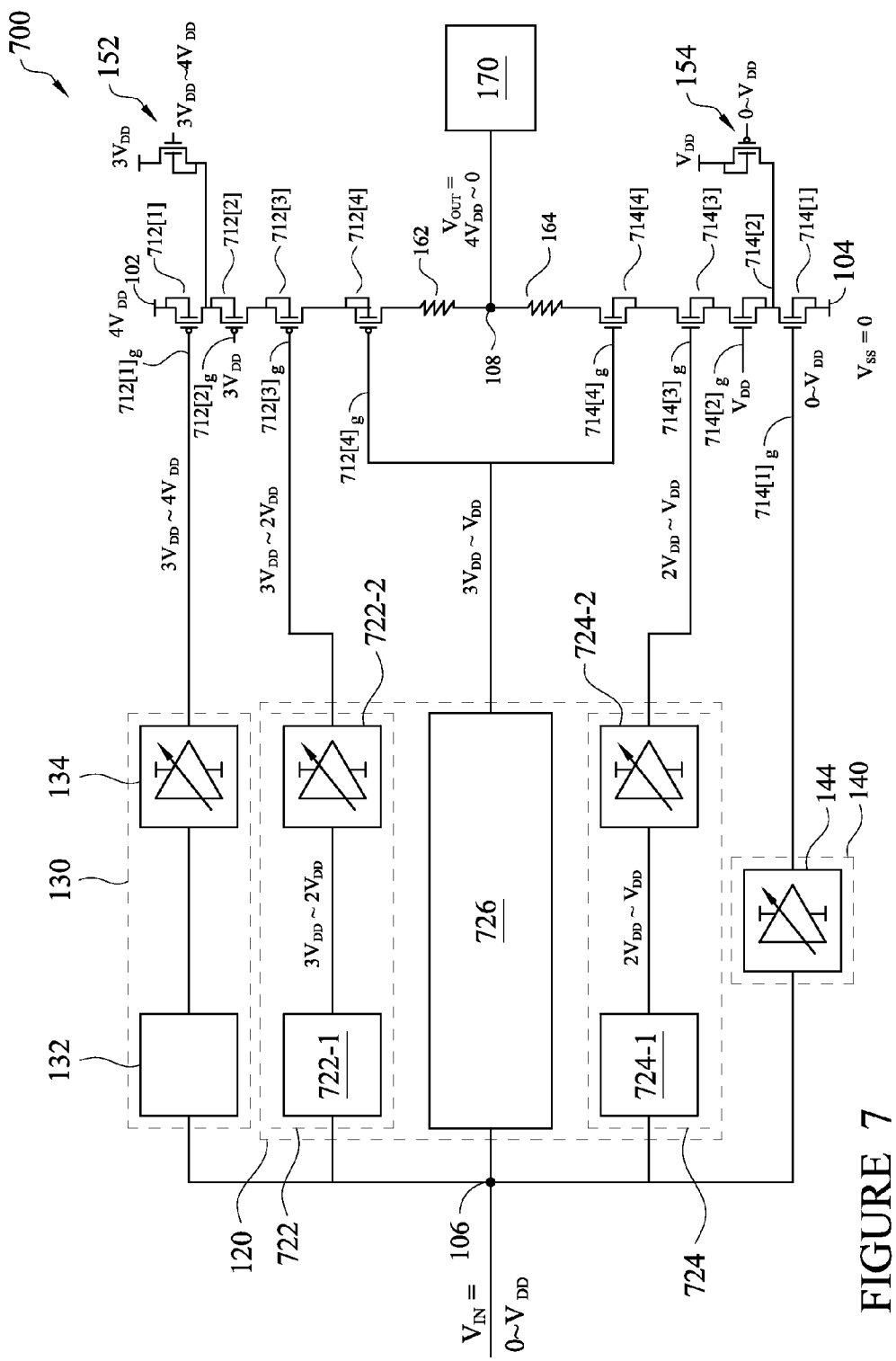
FIG. 7 is a circuit diagram of an I/O circuit in accordance with some embodiments.

FIG. 7 is a circuit diagram of an I/O circuit 700 in accordance with some embodiments. I/O circuit 700 is configured based on I/O circuit 100 when K is set to be 4. Components of I/O circuit 700 that are the same or similar to those of I/O circuit 100 are given the same reference numbers, and description thereof is omitted.

IO circuit 700 has a first P-type transistor 712[1], a second P-type transistor 712[2], a third P-type transistor 712[3], and a fourth P-type transistor 712[4] serially connected between power node 102 and output node 108, and a first N-type transistor 714[1], a second N-type transistor 714[2], a third N-type transistor 714[3], and a fourth N-type transistor 714[4] serially connected between power node 104 and output node 108.

IO circuit 700 further includes control signal generation units 120, 130, and 140, parking circuits 152 and 154, resistive devices 162 and 164, and an output pad module 170. Configurations and operations of I/O circuit 700 are similar or the same as those of I/O circuit 100, and thus corresponding description is omitted.

Control signal generation unit 120 includes driver circuits 722, 724, 726. Driver circuit 722 is configured to set the voltage level at the gate 712[3]g of the third P-type transistor 712[3] at $3 \cdot V_{DD}$ after the input signal $V_{IN}$ is set at the zero reference level, and at $2 \cdot V_{DD}$ after the input signal is set at $V_{DD}$. Driver circuit 722 includes a level shifter 722-1 and a delay unit 722-2. In some embodiments, level shifter 722-1 is implemented based on level-shifting circuit 400B of FIG. 4B, where H is 3. Driver circuit 724 is configured to set the voltage level at the gate 714[3]g of the third N-type transistor 714[3] at $2 \cdot V_{DD}$ after the input signal $V_{IN}$ is set at the zero reference level, and at $V_{DD}$ after the input signal is set at $V_{DD}$. Driver circuit 724 includes a level shifter 724-1 and a delay unit 724-2. In some embodiments, level shifter 724-1 is implemented based on level-shifting circuit 400A of FIG. 4A, where H is 2.

Driver circuit 726 is configured to set a voltage level at the gate 712[4]g of the fourth P-type transistor 712[4] and a voltage level at the gate 714[4]g of the fourth N-type transistor 714[4] at $3 \cdot V_{DD}$ after the input signal $V_{IN}$ is set at the zero reference level, and at $V_{DD}$ after the input signal $V_{IN}$ is set at $V_{DD}$. In some embodiments, driver circuit 726 is implemented based on driver circuit 200 of FIG. 2, where X is 3 and Y is 1.

Figure 8:
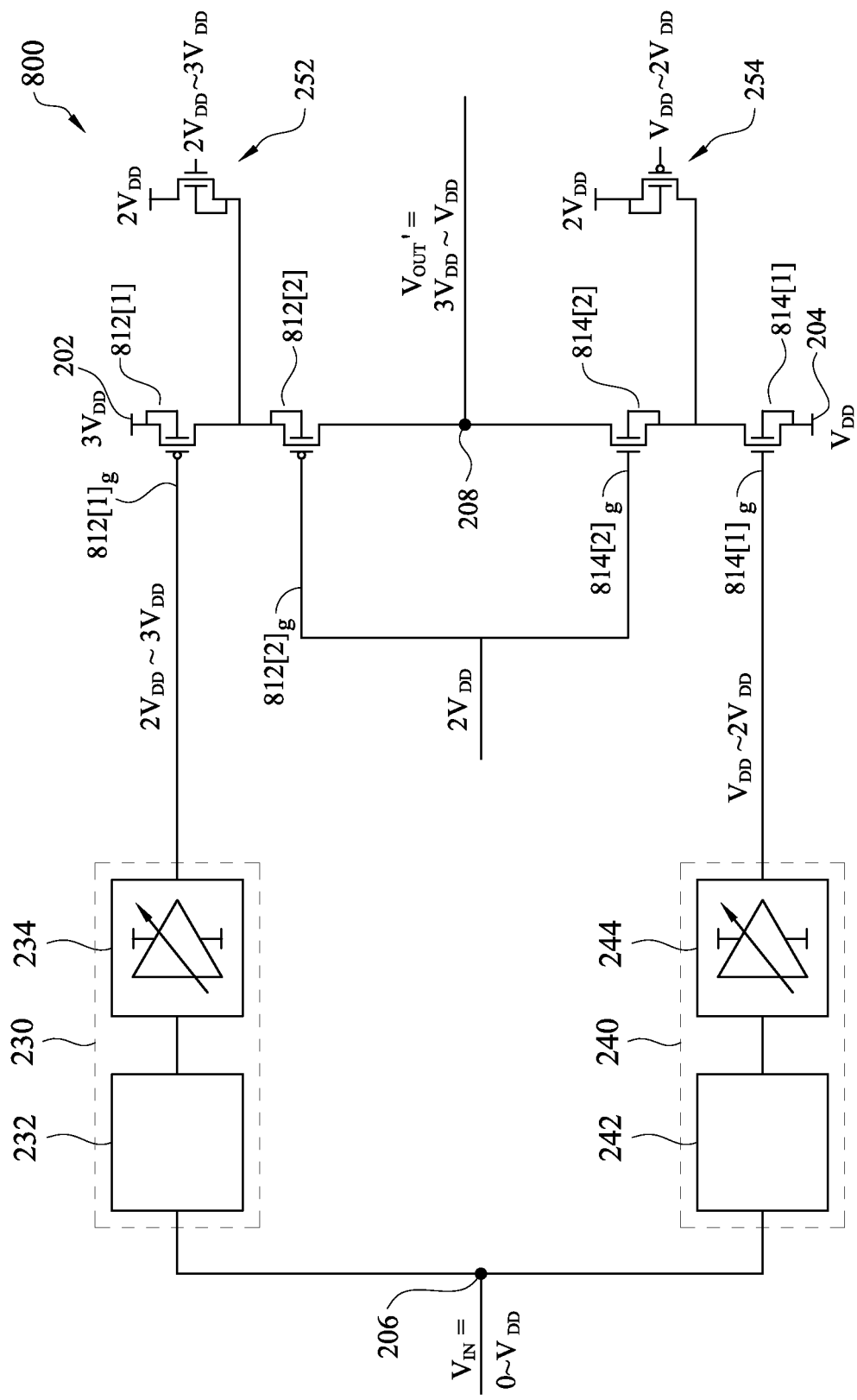
FIG. 8 is a circuit diagram of a driver circuit in accordance with some embodiments.

FIG. 8 is a circuit diagram of a driver circuit 800 in accordance with some embodiments. Driver circuit 800 is usable as driver circuit 726 of FIG. 7 and is configured based on driver circuit 200, when X is set to be 3 and Y is set to be 1 (hence L is 2). Components of driver circuit 800 that are the same or similar to those of driver circuit 200 are given the same reference numbers, and description thereof is omitted.

Driver circuit 800 has a first P-type transistor 812[1] and a second P-type transistor 812[2] serially connected between power node 202 and output node 208, and a first N-type transistor 814[1] and a second N-type transistor 814[2] serially connected between power node 204 and output node 208.

Driver circuit 800 further includes control signal generation units 230 and 240 and parking circuits 252 and 254. Also, because L is set to be 2, control signal generation units 220 is omitted. Configurations and operations of Driver circuit 800 are similar or the same as those of driver circuit 200, and thus corresponding description is omitted.

The circuits depicted in FIG. 6, FIG. 7, and FIG. 8 are just examples for illustrating how I/O circuit 100 is used to design an I/O circuit with a given K value (such as K=3 or 4). In some embodiments, an I/O circuit is implemented based on I/O circuit 100, where K is an integer greater than 4.

Figure 9:
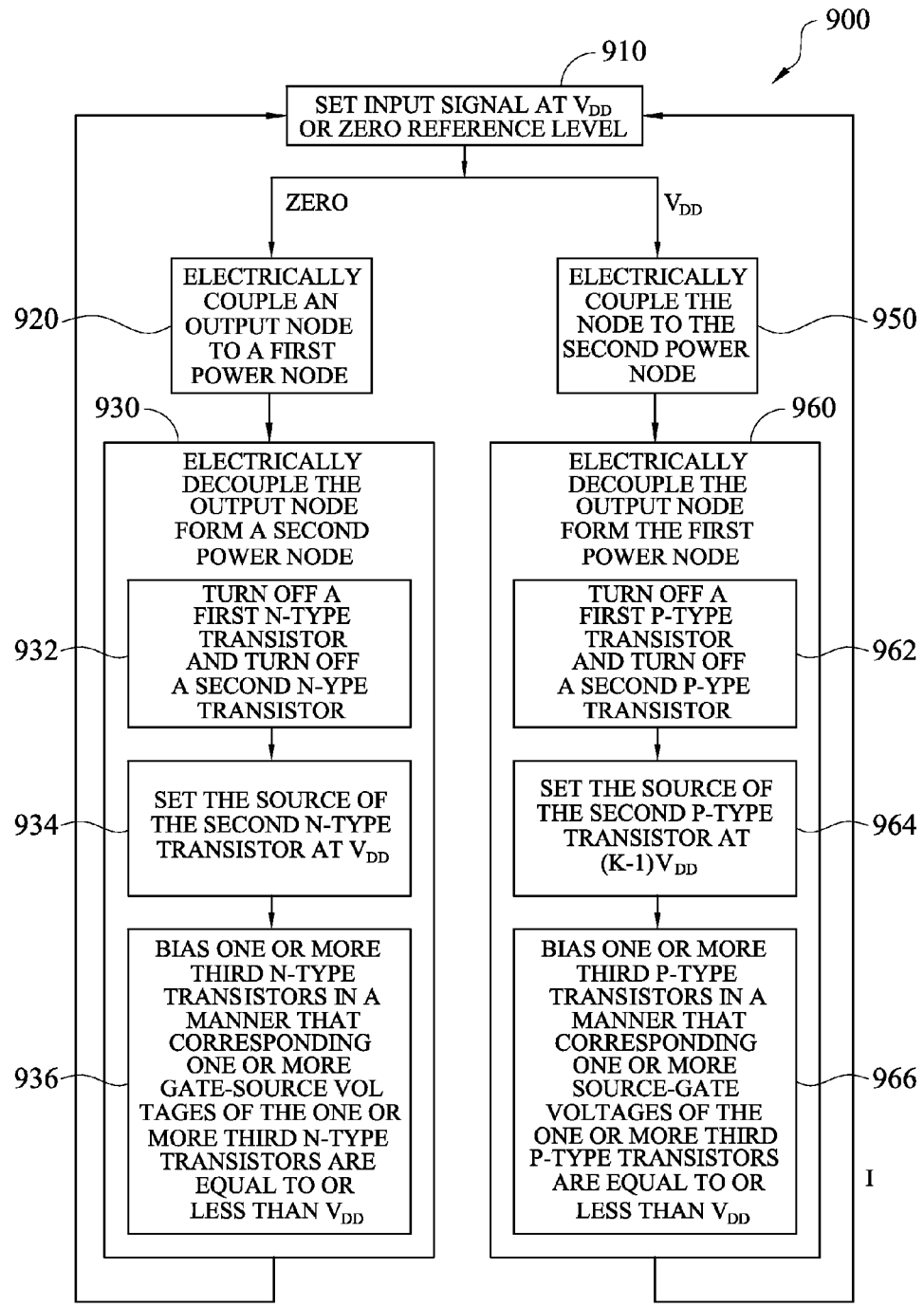
FIG. 9 is a flow chart of a method of operating an I/O circuit in accordance with some embodiments.

FIG. 9 is a flow chart of a method 900 of operating an I/O circuit in accordance with some embodiments. It is understood that additional operations may be performed before, during, and/or after the method 900 depicted in FIG. 9, and that some other processes may only be briefly described herein.

As depicted in FIG. 9 and FIG. 1, the process 900 begins at operation 910, where an input signal $V_{IN}$ is set a zero reference level or at $V_{DD}$. If input signal $V_{IN}$ is set at the zero reference level, the process proceeds to operations 920 and 930. If input signal $V_{IN}$ is set at $V_{DD}$, the process proceeds to operations 950 and 960.

In operation 920, an output node, such as node 108 in FIG. 1, is electrically coupled to a first power node 102. The first power node 102 is configured to carry a first voltage having a voltage level of $K \cdot V_{DD}$. In some embodiments, operation 920 includes biasing gates of a first P-type transistor 112[1], a second P-type transistor 112[2], and one or more third P-type transistors 112[3]~112[K] at $(K-1) \cdot V_{DD}$.

In operation 930, the output node 108 is electrically decoupled from a second power node after the input signal is set at zero reference level. Second power node 108 is configured to carry a second voltage having a voltage level of the zero reference level. Operation 930 includes turning off a first N-type transistor 114[1] and turning off a second N-type transistor 114[2] (operation 932), setting a source 114[2]s of transistor 114[2] at $V_{DD}$ (operation 934), and biasing one or more third N-type transistors 114[3]~114[K] in a manner that corresponding one or more absolute values of gate-source voltages and gate-drain voltages of the one or more third N-type transistors 114[3]~114[K] are equal to or less than $V_{DD}$. In some embodiments, operation 930 is performed with one or more of operations 932, 934, or 936 are omitted. After operation 930, the process returns to operation 910.

In operation 950, output node 108 is electrically coupled to second power node 104. In some embodiments, operation 950 includes biasing gates of the first N-type transistor 114[1], the second N-type transistor 114[2], and the one or more third N-type transistors 114[3]~114[K] at $V_{DD}$.

In operation 960, the output node 108 is electrically decoupled from the first power node 102 after the input signal is set at $V_{DD}$. Operation 960 includes turning off the first P-type transistor 112[1] and turning off the second P-type transistor 112[2] (operation 962), setting a source 112[2]s of transistor 112[2] at $(K-1)\cdot V_{DD}$ (operation 964), and biasing the one or more third P-type transistors 112[3]~112[K] in a manner that corresponding one or more absolute values of source-gate voltages and drain-gate voltages of the one or more third P-type transistors 112[3]~112[K] are equal to or less than $V_{DD}$. In some embodiments, operation 960 is performed with one or more of operations 962, 964, or 966 are omitted. After operation 960, the process returns to operation 910.

One aspect of this description relates to a circuit. The circuit includes a first power node, a second power node, an output node, a plurality of first transistors and a plurality of second transistors. The first power node is configured to carry a first voltage level, and the second power node is configured to carry a second voltage level. The plurality of first transistors is serially coupled between the first power node and the output node. A gate terminal of a first transistor of the plurality of first transistors is configured to receive a first signal being set at a third voltage level after an input signal is set at a zero reference voltage level, and being set at the first voltage level after the input signal is set at a fourth voltage level. A gate terminal of a second transistor of the plurality of first transistors is configured to receive a second signal being set at the third voltage level. A gate terminal of a third transistor of the plurality of first transistors is configured to receive a third signal being set in a manner that an absolute value of a source-gate voltage or an absolute value of a drain-gate voltage of the third transistor of the plurality of first transistors is equal to or less than the fourth voltage level. The plurality of second transistors is serially coupled between the second power node and the output node. A gate terminal of a first transistor of the plurality of second transistors is configured to receive a fourth signal being set at the second voltage level after the input signal is set at the second voltage level and being set at the fourth voltage level after the input signal is set at the fourth voltage level. A gate terminal of a second transistor of the plurality of second transistors is configured to receive a fifth signal being set at the fourth voltage level. A gate terminal of a third transistor of the plurality of second transistors is configured to receive a sixth signal being set in a manner that an absolute value of a gate-source voltage or an absolute value of a gate-drain voltage of the third transistor of the plurality of second transistors is equal to or less than the fourth voltage level.

Another aspect of this description relates to a circuit. The circuit includes a first power node, a second power node, an output node, a first transistor, a second transistor, a third transistor, a fourth transistor, a fifth transistor and a sixth transistor. The first power node is configured to carry a first signal having a voltage level of $K\cdot V_{DD}$, $V_{DD}$ being a positive value, and K being a positive integer. The second power node is configured to carry a second signal having a zero reference voltage level. The first transistor has a source terminal coupled to the first power node, a drain terminal, and a gate terminal configured to receive a third signal having a voltage level ranging from $(K-1)\cdot V_{DD}$ to $K\cdot V_{DD}$. The second transistor has a source terminal coupled to the drain terminal of the first transistor, a drain terminal, and a gate terminal biased at $(K-1)\cdot V_{DD}$. The third transistor has a source terminal coupled to the drain terminal of the second transistor, the first, second, and third transistors being configured to pull a voltage level at the output node toward $K\cdot V_{DD}$ through a drain terminal of the third transistor after an input signal is set at the zero reference voltage level. The fourth transistor has a source terminal coupled to the second power node, a drain terminal, and a gate terminal configured to receive a fourth signal having a voltage level ranging from the zero reference voltage level to $V_{DD}$. The fifth transistor has a source terminal coupled to the drain terminal of the fourth transistor, a drain terminal, and a gate terminal biased at $V_{DD}$. The sixth transistor has a source terminal coupled to the drain terminal of the fifth transistor, the fourth, fifth and sixth transistors being configured to pull the voltage level at the output node toward the zero reference voltage level through a drain terminal of the sixth transistor after the input signal is set at $V_{DD}$.

Still another aspect of this description relates to a method. The method includes electrically coupling an output node to a first power node having a first voltage level after an input signal is set at a zero reference voltage level; electrically decoupling the output node from the first power node after the input signal is set at a second voltage level; electrically coupling the output node to a second power node having the zero reference voltage level after the input signal is set at the second voltage level; and electrically decoupling the output node from the second power node after the input signal is set at the zero reference voltage level. The step of electrically decoupling the output node from the first power node after the input signal is set at a second voltage level includes turning off a first transistor having a source terminal coupled to the first power node; turning off a second transistor having a source terminal coupled to a drain terminal of the first transistor; and biasing a third transistor in a manner that an absolute value of a source-gate voltage and an absolute value of a drain-gate voltage of the third transistor are equal to or less than the second voltage level, and the third transistor being serially coupled between a drain terminal of the second transistor and the output node. The step of electrically decoupling the output node from the second power node after the input signal is set at the zero reference voltage level includes turning off a fourth transistor having a source terminal coupled to the second power node; turning off a fifth transistor having a source terminal coupled to a drain terminal of the fourth transistor; and biasing a sixth transistor in a manner that an absolute value of a gate-source voltage and an absolute value of a gate-drain voltage of the sixth transistor are equal to or less than the second voltage level, and the sixth transistor being serially coupled between a drain terminal of the fifth transistor and the output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first power node configured to carry a first voltage level;
a second power node configured to carry a second voltage level;
an output node;
a plurality of first transistors serially coupled between the first power node and the output node,
a gate terminal of a first transistor of the plurality of first transistors is configured to receive a first signal being set at:
 a third voltage level after an input signal is set at a zero reference voltage level, and
 the first voltage level after the input signal is set at a fourth voltage level;
a gate terminal of a second transistor of the plurality of first transistors is configured to receive a second signal being set at the third voltage level; and
a gate terminal of a third transistor of the plurality of first transistors is configured to receive a third signal being set in a manner that an absolute value of a source-gate voltage or an absolute value of a drain-gate voltage of the third transistor of the plurality of first transistors is equal to or less than the fourth voltage level; and
a plurality of second transistors serially coupled between the second power node and the output node,
a gate terminal of a first transistor of the plurality of second transistors is configured to receive a fourth signal being set at:
 the second voltage level after the input signal is set at the second voltage level, and
 the fourth voltage level after the input signal is set at the fourth voltage level;
a gate terminal of a second transistor of the plurality of second transistors is configured to receive a fifth signal being set at the fourth voltage level; and
a gate terminal of a third transistor of the plurality of second transistors is configured to receive a sixth signal being set in a manner that an absolute value of a gate-source voltage or an absolute value of a gate-drain voltage of the third transistor of the plurality of second transistors is equal to or less than the fourth voltage level.

2. The circuit of claim 1, further comprising:
a first control signal generating circuit configured to generate the first signal;
a second control signal generating circuit configured to generate the fourth signal; and
a third control signal generating circuit configured to generate the third signal and the sixth signal.

3. The circuit of claim 2, wherein the first control signal generating circuit comprises:
a level shifting circuit configured to generate an intermediate signal based on the input signal; and
a delay circuit configured to generate the first signal based on the intermediate signal.

4. The circuit of claim 2, wherein the first control signal generating circuit comprises:
a latch circuit configured to generate an intermediate signal based on the input signal; and
a capacitive circuit configured to be charged by the intermediate signal, and to generate the first signal.

5. The circuit of claim 1, further comprising:
a first parking circuit coupled to the second transistor of the plurality of first transistors, and configured to set a source terminal of the second transistor of the plurality of first transistors at the third voltage level after the input signal is set at the fourth voltage level; and
a second parking circuit coupled to the second transistor of the plurality of second transistors, and configured to set a source terminal of the second transistor of the plurality of second transistors at the fourth voltage level after the input signal is set at the zero reference voltage level.

6. The circuit of claim 1, further comprising:
a first resistive circuit between the third transistor of the plurality of first transistors and the output node; and
a second resistive circuit between the third transistor of the plurality of second transistors and the output node.

7. The circuit of claim 2, wherein the first control signal generating circuit is configured to shift a voltage level of the input signal to a voltage level of the first signal, the input signal having a voltage swing between the zero reference voltage level and the fourth voltage level, and the first signal having a voltage swing between the third voltage level and the first voltage level.

8. The circuit of claim 2, wherein the second control signal generating circuit comprises:
a delay circuit configured to generate the fourth signal based on the input signal.

9. A circuit, comprising:
a first power node configured to carry a first signal having a voltage level of $K \cdot V_{DD}$, $V_{DD}$ being a positive value, and K being a positive integer;
a second power node configured to carry a second signal having a zero reference voltage level;
an output node;
a first transistor having a source terminal coupled to the first power node, a drain terminal, and a gate terminal configured to receive a third signal having a voltage level ranging from $(K-1) \cdot V_{DD}$ to $K \cdot V_{DD}$;
a second transistor having a source terminal coupled to the drain terminal of the first transistor, a drain terminal, and a gate terminal biased at $(K-1) \cdot V_{DD}$;
a third transistor having a source terminal coupled to the drain terminal of the second transistor, the first, second, and third transistors being configured to pull a voltage level at the output node toward $K \cdot V_{DD}$ through a drain terminal of the third transistor after an input signal is set at the zero reference voltage level;
a fourth transistor having a source terminal coupled to the second power node, a drain terminal, and a gate terminal configured to receive a fourth signal having a voltage level ranging from the zero reference voltage level to $V_{DD}$;
a fifth transistor having a source terminal coupled to the drain terminal of the fourth transistor, a drain terminal, and a gate terminal biased at $V_{DD}$; and
a sixth transistor having a source terminal coupled to the drain terminal of the fifth transistor, the fourth, fifth and sixth transistors being configured to pull the voltage level at the output node toward the zero reference voltage level through a drain terminal of the sixth transistor after the input signal is set at $V_{DD}$.

10. The circuit of claim 9, further comprising a first control signal generating circuit configured to generate:
a fifth signal provided to a gate terminal of the third transistor, the fifth signal being set in a manner that an absolute value of a source-gate voltage or an absolute value of a drain-gate voltage of the third transistor is equal to or less than $V_{DD}$, and
a sixth signal provided to a gate terminal of the sixth transistor, the sixth signal being set in a manner that an absolute value of a source-gate voltage or an absolute value of a drain-gate voltage of the sixth transistor is equal to or less than $V_{DD}$.

11. The circuit of claim 10, further comprising:
a second control signal generating circuit configured to generate the third signal; and
a third control signal generating circuit configured to generate the fourth signal.

12. The circuit of claim 9, further comprising a control signal generating circuit comprising:
a first portion configured to generate the third signal;
a second portion configured to generate the fourth signal; and
a third portion configured to generate
a fifth signal provided to a gate terminal of the third transistor, the fifth signal being set in a manner that an absolute value of a source-gate voltage or an absolute value of a drain-gate voltage of the third transistor is equal to or less than $V_{DD}$, and
a sixth signal provided to a gate terminal of the sixth transistor, the sixth signal being set in a manner that an absolute value of a source-gate voltage or an absolute value of a drain-gate voltage of the sixth transistor is equal to or less than $V_{DD}$.

13. The circuit of claim 9, wherein the first transistor, the second transistor, the third transistor, the fourth transistor, the fifth transistor and the sixth transistor are configured to be electrically overstressed if an absolute value of a gate-source voltage or an absolute value of a gate-drain voltage is greater than 1.4·VDD.

14. The circuit of claim 9, further comprising:
a seventh transistor having a drain terminal coupled to the drain terminal of the first transistor, the seventh transistor configured to set the drain terminal of the first transistor at a voltage level ranging from $(K-1) \cdot V_{DD}$ to $K \cdot V_{DD}$; and
an eighth transistor having a drain terminal coupled to the drain terminal of the fourth transistor, the eighth transistor configured to set the drain terminal of the fourth transistor at a voltage level ranging from the zero reference voltage level to $V_{DD}$.

15. The circuit of claim 9, further comprising:
a level shifting circuit comprising (H−1) latch circuits, the level shifting circuit being configured to raise a voltage level of the input signal to a voltage level of an intermediate signal, the input signal having a voltage swing between the zero reference voltage level and $V_{DD}$, and the intermediate signal having a voltage swing between $(H-1) \cdot V_{DD}$ and $H \cdot V_{DD}$, H is a positive integer equal to or greater than 2;
wherein a first latch circuit of the (H−1) latch circuits is configured to raise the voltage level of the input signal to
a voltage swing ranging between $V_{DD}$ and $2 \cdot V_{DD}$ when H is an even number, or
a voltage swing ranging between $2 \cdot V_{DD}$ and $V_{DD}$ when H is an odd number.

16. A method, comprising:
electrically coupling an output node to a first power node having a first voltage level after an input signal is set at a zero reference voltage level;
electrically decoupling the output node from the first power node after the input signal is set at a second voltage level, comprising:
turning off a first transistor having a source terminal coupled to the first power node;
turning off a second transistor having a source terminal coupled to a drain terminal of the first transistor; and
biasing a third transistor in a manner that an absolute value of a source-gate voltage and an absolute value of a drain-gate voltage of the third transistor are equal to or less than the second voltage level, and the third transistor being serially coupled between a drain terminal of the second transistor and the output node;
electrically coupling the output node to a second power node having the zero reference voltage level after the input signal is set at the second voltage level; and
electrically decoupling the output node from the second power node after the input signal is set at the zero reference voltage level, comprising:
turning off a fourth transistor having a source terminal coupled to the second power node;
turning off a fifth transistor having a source terminal coupled to a drain terminal of the fourth transistor; and
biasing a sixth transistor in a manner that an absolute value of a gate-source voltage and an absolute value of a gate-drain voltage of the sixth transistor are equal to or less than the second voltage level, and the sixth transistor being serially coupled between a drain terminal of the fifth transistor and the output node.

17. The method of claim 16, further comprising:
setting the source terminal of the second transistor at a third voltage level after the input signal is set at the second voltage level; and
setting the source terminal of the fourth transistor at the second voltage level after the input signal is set at the zero reference voltage level.

18. The method of claim 16, wherein turning off the first transistor comprises:
shifting the input signal to a first signal, the input signal having the second voltage level, and the first signal having the first voltage level;
delaying the first signal; and
providing the delayed first signal to a gate terminal of the first transistor.

19. The method of claim 16, wherein turning off the second transistor comprises:
biasing a gate terminal of the second transistor at a third voltage level.

20. The method of claim 16, wherein turning off the fourth transistor comprises:
delaying the input signal; and
providing the delayed input signal to a gate terminal of the fourth transistor.

* * * * *